(12) United States Patent
Miyagi et al.

(10) Patent No.: US 10,134,610 B2
(45) Date of Patent: Nov. 20, 2018

(54) SUBSTRATE PROCESSING METHOD FOR DRYING A SUBSTRATE BY DISCHARGING GAS TO LIQUID LAYER ON THE SUBSTRATE WHILE ROTATING THE SUBSTRATE

(75) Inventors: Tadashi Miyagi, Kyoto (JP); Masashi Kanaoka, Kyoto (JP); Kazuhito Shigemori, Kyoto (JP); Shuichi Yasuda, Kyoto (JP); Masakazu Sanada, Kyoto (JP)

(73) Assignee: Screen Semiconductor Solutions Co., Ltd., Kyoto (JP)

( * ) Notice: Subject to any disclaimer, the term of this patent is extended or adjusted under 35 U.S.C. 154(b) by 1470 days.

(21) Appl. No.: 12/208,992

(22) Filed: Sep. 11, 2008

(65) Prior Publication Data

US 2009/0071940 A1    Mar. 19, 2009

(30) Foreign Application Priority Data

Sep. 13, 2007    (JP) .................................. 2007-237701

(51) Int. Cl.
*B05D 3/04*    (2006.01)
*H01L 21/67*   (2006.01)
(Continued)

(52) U.S. Cl.
CPC ........ *H01L 21/67034* (2013.01); *B05C 11/08* (2013.01); *B05C 13/02* (2013.01);
(Continued)

(58) Field of Classification Search
CPC ......... H01L 21/67034; H01L 21/67028; H01L 51/0003; H01L 21/02282; H01L 21/0276;
(Continued)

(56) References Cited

U.S. PATENT DOCUMENTS 5,361,449 A * 11/1994 Akimoto ..................... 15/302
5,366,757 A    11/1994 Lin
(Continued)

FOREIGN PATENT DOCUMENTS

CN    1442758 A    9/2003
CN    101017332 A   8/2007
(Continued)

OTHER PUBLICATIONS

Office Action of Korean Application No. 10-2008-0086376, dated Aug. 19, 2010, 3 pages total. [No English Translation].
(Continued)

*Primary Examiner* — Karl Kurple
(74) *Attorney, Agent, or Firm* — Kilpatrick Townsend & Stockton LLP

(57) ABSTRACT

After a development liquid on a substrate is washed away with a rinse liquid, the rotational speed of the substrate is reduced, so that a liquid layer of the rinse liquid is formed over a top surface of the substrate. Thereafter, the rotational speed of the substrate is increased. The increase in the rotational speed of the substrate causes a centrifugal force to be slightly greater than tension, thereby causing the liquid layer to be held on the substrate with the thickness thereof in its peripheral portion increased and the thickness thereof at the center thereof decreased. Then, gas is discharged toward the center of the liquid layer from a gas supply nozzle, so that a hole is formed at the center of the liquid layer. This causes tension that is balanced with a centrifugal force exerted on the peripheral portion of the liquid layer to disappear. Furthermore, the rotational speed of the substrate is further increased while the gas is discharged. Thus, the liquid layer moves outward from the substrate.

2 Claims, 7 Drawing Sheets

(51) Int. Cl.
*B05C 11/08* (2006.01)
*B05C 13/02* (2006.01)
*G03F 7/30* (2006.01)

(52) U.S. Cl.
CPC ......... *B05D 3/0406* (2013.01); *G03F 7/3028* (2013.01); *H01L 21/67028* (2013.01); *H01L 21/67051* (2013.01); *Y10S 134/902* (2013.01)

(58) Field of Classification Search
CPC ..... H01L 21/67051; H01L 2224/03416; H01L 2224/17; H01L 2224/18; H01L 2224/19; Y10S 134/902; B05D 1/005; G03F 7/162; F26B 5/08
USPC .......... 216/83; 156/345.23, 345.15; 427/498, 427/512; 118/300, 320, 730; 438/782; 396/611
See application file for complete search history.

(56) References Cited

U.S. PATENT DOCUMENTS

| | | | | |
|---|---|---|---|---|
| 5,762,709 | A * | 6/1998 | Sugimoto | B05C 11/08 118/319 |
| 5,882,433 | A * | 3/1999 | Ueno | H01L 21/67028 134/31 |
| 5,989,632 | A * | 11/1999 | Sanada | G03F 7/162 427/240 |
| 5,997,653 | A * | 12/1999 | Yamasaka | B08B 3/02 134/102.1 |
| 6,436,851 | B1 * | 8/2002 | Young | H01L 21/312 257/E21.259 |
| 6,503,335 | B2 * | 1/2003 | Hohl et al. | 134/33 |
| 6,656,277 | B2 * | 12/2003 | Sanada et al. | 118/320 |
| 6,770,151 | B1 * | 8/2004 | Ravkin et al. | 134/33 |
| 6,834,440 | B2 * | 12/2004 | Lee | 34/58 |
| 7,604,013 | B2 * | 10/2009 | Nakamura et al. | 134/95.2 |
| 8,038,799 | B2 * | 10/2011 | Nagai et al. | 134/3 |
| 8,124,320 | B2 * | 2/2012 | Blalock | 430/311 |
| 8,127,391 | B2 * | 3/2012 | Nonomura et al. | 15/77 |
| 8,166,913 | B2 * | 5/2012 | Tanaka | G03F 7/162 118/313 |
| 8,218,124 | B2 * | 7/2012 | Miyagi | H01L 21/67034 134/33 |
| 8,894,775 | B2 * | 11/2014 | Miyagi | H01L 21/67051 134/26 |
| 2001/0001407 | A1 * | 5/2001 | You et al. | 156/166 |
| 2001/0005639 | A1 * | 6/2001 | Yonaha | 438/782 |
| 2001/0021594 | A1 * | 9/2001 | Yoo | 438/784 |
| 2001/0029111 | A1 * | 10/2001 | You et al. | 438/782 |
| 2001/0050050 | A1 | 12/2001 | Nishiya et al. | |
| 2002/0076945 | A1 * | 6/2002 | Hall et al. | 438/782 |
| 2002/0189639 | A1 * | 12/2002 | Aoki | B08B 3/04 134/2 |
| 2003/0044530 | A1 * | 3/2003 | Morikawa et al. | 427/240 |
| 2003/0119318 | A1 * | 6/2003 | Niuya et al. | 438/690 |
| 2004/0050491 | A1 * | 3/2004 | Miya et al. | 156/345.11 |
| 2004/0103915 | A1 * | 6/2004 | Verhaverbeke et al. | 134/1.3 |
| 2004/0116312 | A1 * | 6/2004 | Schlicht et al. | 510/175 |
| 2004/0118676 | A1 * | 6/2004 | Mizohata et al. | 204/193 |
| 2004/0253368 | A1 * | 12/2004 | Tokuda | H01L 27/3246 427/64 |
| 2005/0250054 | A1 * | 11/2005 | Chang | 430/329 |
| 2005/0272348 | A1 * | 12/2005 | Min et al. | 451/11 |
| 2006/0046413 | A1 * | 3/2006 | Edamoto | H01L 21/67051 438/366 |
| 2006/0048792 | A1 | 3/2006 | Nakamura | |
| 2006/0079085 | A1 * | 4/2006 | Baskaran et al. | 438/652 |
| 2006/0147202 | A1 | 7/2006 | Yasuda et al. | |
| 2006/0152694 | A1 * | 7/2006 | Yasuda et al. | 355/27 |
| 2006/0206389 | A1 * | 9/2006 | Elssner et al. | 705/26 |
| 2007/0116459 | A1 * | 5/2007 | Takeguchi | B08B 3/04 396/604 |
| 2007/0166031 | A1 * | 7/2007 | Hamada | H01L 21/67028 396/611 |
| 2007/0172233 | A1 * | 7/2007 | Hamada | G03D 3/00 396/611 |
| 2007/0177870 | A1 * | 8/2007 | Hamada | H01L 21/67051 396/611 |
| 2007/0183775 | A1 * | 8/2007 | Mitsuhashi | G03F 7/3021 396/611 |
| 2007/0190437 | A1 * | 8/2007 | Kaneyama | G03F 7/168 430/30 |
| 2007/0223342 | A1 * | 9/2007 | Orii et al. | 369/69 |
| 2007/0246079 | A1 * | 10/2007 | Pham | 134/26 |
| 2008/0016714 | A1 * | 1/2008 | Kaneyama | H01L 21/67051 34/317 |
| 2008/0053487 | A1 * | 3/2008 | Goto | H01L 21/02057 134/32 |
| 2008/0057194 | A1 * | 3/2008 | Tanaka | 427/240 |
| 2008/0078423 | A1 * | 4/2008 | Araki | H01L 21/02057 134/22.19 |
| 2008/0090186 | A1 * | 4/2008 | Harumoto et al. | 430/434 |
| 2008/0092929 | A1 * | 4/2008 | Yokouchi | 134/30 |
| 2008/0190455 | A1 * | 8/2008 | Kinoshita | B08B 3/02 134/21 |
| 2008/0203058 | A1 * | 8/2008 | Harumoto et al. | 216/83 |
| 2008/0223412 | A1 * | 9/2008 | Lee et al. | 134/33 |
| 2008/0263793 | A1 * | 10/2008 | Nakano et al. | 15/77 |
| 2009/0017190 | A1 * | 1/2009 | Sferlazzo et al. | 427/10 |
| 2009/0074402 | A1 * | 3/2009 | Miyagi | H01L 21/67051 396/611 |
| 2009/0226621 | A1 * | 9/2009 | Yamashita et al. | 427/346 |
| 2010/0136492 | A1 | 6/2010 | Yasuda et al. | |
| 2010/0151126 | A1 * | 6/2010 | Iseki et al. | 427/240 |
| 2010/0209607 | A1 * | 8/2010 | Takayanagi et al. | 427/240 |
| 2011/0045414 | A1 | 2/2011 | Takeguchi et al. | |
| 2011/0155181 | A1 * | 6/2011 | Inatomi | H01L 21/02052 134/30 |
| 2011/0170855 | A1 | 7/2011 | Mitsuhashi et al. | |
| 2012/0021611 | A1 * | 1/2012 | Yoshihara et al. | 438/782 |
| 2012/0061806 | A1 * | 3/2012 | Liu et al. | 257/629 |
| 2012/0064712 | A1 * | 3/2012 | Lei et al. | 438/614 |
| 2012/0080061 | A1 * | 4/2012 | Kim et al. | 134/95.2 |
| 2012/0111373 | A1 * | 5/2012 | Arima | G03F 7/422 134/30 |
| 2012/0276753 | A1 * | 11/2012 | Yoshihara et al. | 438/782 |
| 2016/0167079 | A1 * | 6/2016 | Hasimoto | G05B 15/02 700/283 |

FOREIGN PATENT DOCUMENTS

| | | |
|---|---|---|
| JP | 06-120133 A | 4/1994 |
| JP | 07-135137 A | 5/1995 |
| JP | 2001-118778 A | 4/2001 |
| JP | 2002-075854 A | 3/2002 |
| JP | 2003-031488 | 1/2003 |
| JP | 2003-257833 A | 9/2003 |
| JP | 2004-103978 A | 4/2004 |
| JP | 2004-335542 A | 11/2004 |
| JP | 2005-197455 A | 7/2005 |
| JP | 2007-134516 A | 5/2007 |
| JP | 2007-214200 A | 8/2007 |
| KR | 2006-0063684 A | 6/2006 |
| KR | 2007-008562 A | 8/2007 |
| KR | 2007-0080562 A | 8/2007 |
| WO | WO2007005 4377 A1 * | 5/2007 ............... B08B 3/04 |

OTHER PUBLICATIONS

Office Action in the counterpart Chinese Application No. 200810149147.1, dated Feb. 24, 2011, 6 pages.
Office Action of the counterpart Korean Application No. 10-2008-0086376, dated Feb. 24, 2011, 4 pages.
Office Action for corresponding Japanese patent application No. 2007-237701 dated May 8, 2012, 3 pages.
Office Action for corresponding Taiwanese patent application No. 097134501 dated Oct. 11, 2012, 6 pages.

(56) References Cited

OTHER PUBLICATIONS

Invalidation Trial for corresponding Korean Patent No. 10-1042762 mailed on Dec. 12, 2011, 41 pages.

* cited by examiner

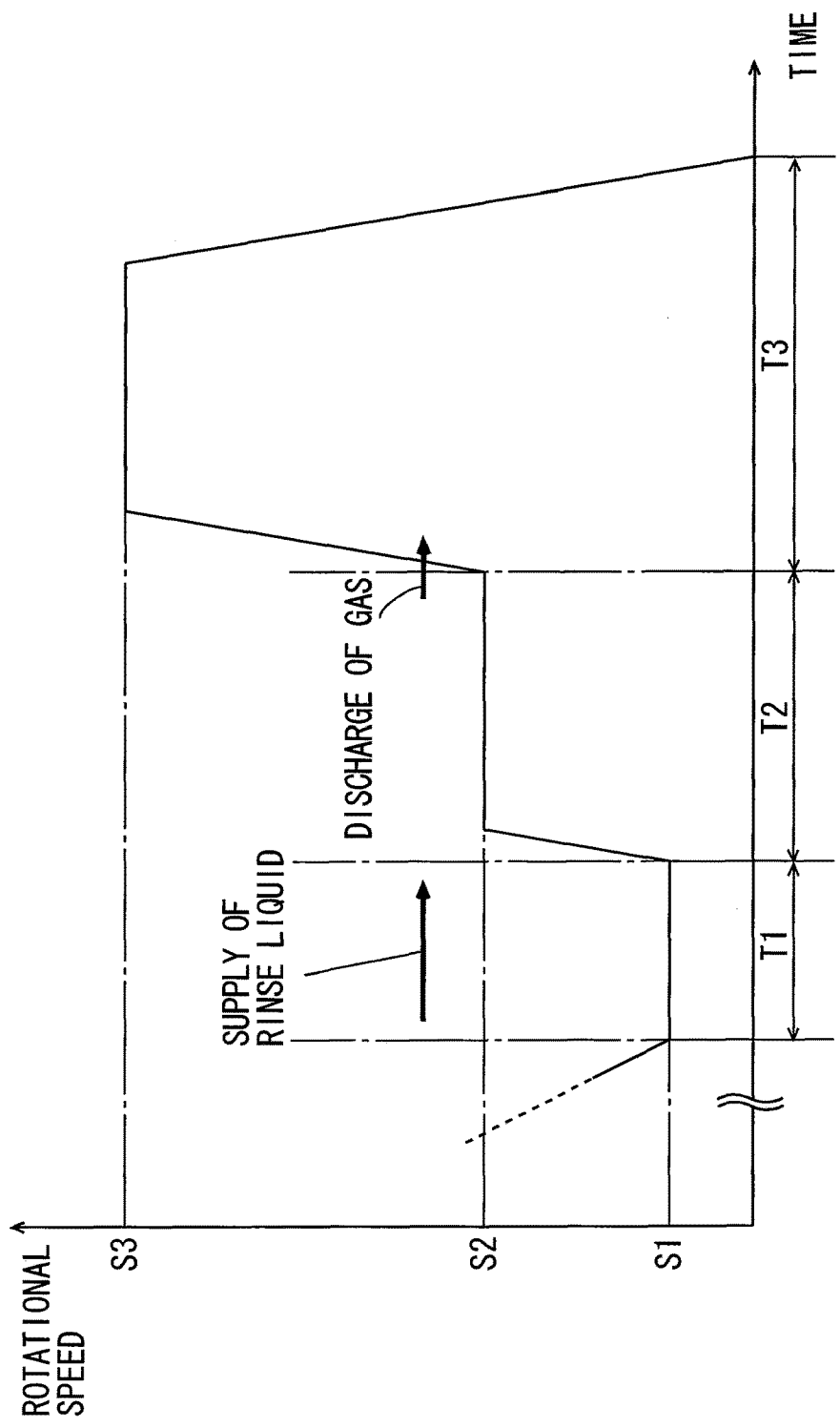
F I G. 5

SUBSTRATE PROCESSING METHOD FOR DRYING A SUBSTRATE BY DISCHARGING GAS TO LIQUID LAYER ON THE SUBSTRATE WHILE ROTATING THE SUBSTRATE

CROSS-REFERENCES TO RELATED APPLICATIONS

This application claims priority to Japanese Patent Application 2007-237701, filed Sep. 13, 2007. The disclosure of JP 2007-237701 is hereby incorporated by reference its entirety for all purposes.

BACKGROUND OF THE INVENTION

Field of the Invention

The present invention relates to a substrate processing apparatus and a substrate processing method for subjecting substrates to processing.

Description of the Background Art

Substrate processing apparatuses are used to subject various types of substrates such as semiconductor substrates, substrates for liquid crystal displays, plasma displays, optical disks, magnetic disks, magneto-optical disks, and photomasks, and other substrates to various types of processing.

In the substrate processing apparatuses, photosensitive films (resist films) formed on substrates, for example, are subjected to development processing. During the development processing, development liquids are supplied to the resist films on the substrates. After an elapse of a predetermined time period, rinse liquids are supplied onto the substrates, the development processing is stopped, and the development liquids on the substrates are washed away. The rinse liquids on the substrates are shaken off by rotating the substrates at high speeds, so that the substrates are dried (see, for example, JP 2003-31488 A).

Generally when substrates are dried utilizing centrifugal forces, minute droplets of rinse liquids may, in some cases, remain on the substrates. The reason for this is that the minute droplets are difficult to separate from the substrates because small centrifugal forces corresponding to the masses thereof are only exerted thereon. Particularly when the minute droplets adhere to the vicinities of the centers of the substrates, the minute droplets become more difficult to remove because the smaller centrifugal forces are only exerted on the droplets.

Furthermore, hydrophilic portions and hydrophobic portions are mixed on the resist films after the development processing, so that holding forces for the rinse liquids on the resist films vary. This also causes the rinse liquids to easily remain on the substrates. When the droplets thus remain on the substrates, development defects occur.

SUMMARY OF THE INVENTION

An object of the present invention is to provide a substrate processing apparatus and a substrate processing method in which a substrate after development processing can be reliably dried.

(1) According to an aspect of the present invention, a substrate processing apparatus that subjects a substrate after exposure processing to development processing includes a substrate holding device that holds the substrate substantially horizontally, a rotation-driving device that rotates the substrate held by the substrate holding device around an axis perpendicular to the substrate, a development liquid supplier that supplies a development liquid onto the substrate held by the substrate holding device, a liquid layer formation device that forms a liquid layer of a rinse liquid on the substrate held by the substrate holding device after supplying the rinse liquid onto the substrate to wash away the development liquid on the substrate, and a gas discharger that discharges gas toward the center of the liquid layer formed on the substrate by the liquid layer formation device with the substrate rotated by the rotation-driving device.

In the substrate processing apparatus, the development liquid supplier supplies the development liquid onto the substrate held by the substrate holding device, so that the substrate is subjected to the development processing. After the development processing, the liquid layer formation device supplies the rinse liquid onto the substrate so that the development liquid on the substrate is washed away. Thereafter, the liquid layer of the rinse liquid is formed on the substrate.

The gas discharger discharges the gas toward the center of the liquid layer on the substrate with the substrate rotated by the rotation-driving device. In this case, the liquid layer integrally moves outward from the substrate with its annular shape held by surface tension without being separated into a plurality of regions. This inhibits minute droplets from being formed, allowing the substrate to be reliably dried. Therefore, development defects caused by the liquid remaining on the substrate can be reliably prevented from occurring.

(2) The rotation-driving device may rotate the substrate at a first rotational speed when the liquid layer formation device forms the liquid layer and gradually or continuously increase the rotational speed of the substrate to a second rotational speed after the liquid layer formation device forms the liquid layer, and the gas discharger may discharge the gas to the liquid layer on the substrate rotated at a third rotational speed that is higher than the first rotational speed and lower than the second rotational speed.

In this case, the rotation-driving device rotates the substrate at the first rotational speed when the liquid layer is formed. This allows the liquid layer to be uniformly formed on the substrate even with the substrate slightly inclined to a horizontal plane.

After the liquid layer is formed, the rotation-driving device gradually or continuously increases the rotational speed of the substrate. This causes an outward centrifugal force exerted on a peripheral portion of the liquid layer to be increased. On the other hand, tension corresponding to the centrifugal force is exerted on the center of the liquid layer, so that the liquid layer is held on the substrate without being scattered outward.

When the rotational speed of the substrate is the third rotational speed that is higher than the first rotational speed and lower than the second rotational speed in the process of increasing the rotational speed of the substrate, the gas discharger discharges the gas toward the center of the liquid layer on the substrate. This causes the tension exerted on the liquid layer to disappear, causing the liquid layer to move outward from the substrate by the centrifugal force. In this case, the liquid layer integrally moves outward from the substrate with the annular shape held by the surface tension without being separated into a plurality of regions. This inhibits the minute droplets on the substrate from being formed, allowing the liquid layer on the substrate to be reliably removed.

(3) The rotation-driving device may maintain the rotational speed of the substrate at a fourth rotational speed that is higher than the first rotational speed and lower than the second rotational speed for predetermined time period after the liquid layer formation device forms the liquid layer and before the gas discharger discharges the gas.

In this case, the liquid layer spreads over the whole substrate while being stably held on the substrate. This reliably prevents the liquid layer from being scattered outward from the substrate before the gas discharger discharges the gas while allowing the liquid layer to integrally move outward from the substrate with the annular shape reliably held when the gas is discharged.

(4) The substrate processing apparatus may further include a layer thickness detector that detects the thickness of the liquid layer formed on the substrate by the liquid layer formation device, and a controller that controls the rotational speed of the substrate by the rotation-driving device and the timing at which the gas discharger discharges the gas on the basis of the thickness of the liquid layer detected by the layer thickness detector.

In this case, the gas can be discharged with the center of the liquid layer sufficiently thinned and the liquid layer not separated into a plurality of regions by the centrifugal force, which causes the tension exerted on the center of the liquid layer to reliably disappear, allowing the liquid layer to integrally move outward from the substrate with the annular shape held. This allows the liquid layer on the substrate to be reliably removed.

(5) In accordance with another aspect of the present invention, a substrate processing method includes the steps of holding a substrate substantially horizontally, supplying a development liquid onto the held substrate, supplying a rinse liquid onto the substrate to wash away a development liquid, forming a liquid layer of the rinse liquid on the substrate after the development liquid is washed away, and rotating the substrate while discharging gas toward the center of the liquid layer on the substrate.

In the substrate processing method, the development liquid is supplied onto the substrate with the substrate held substantially horizontally, so that the substrate is subjected to development processing. After the development processing, the rinse liquid is supplied onto the substrates so that the development liquid on the substrate is washed away.

Thereafter, the liquid layer of the rinse liquid is formed on the substrate. The gas is discharged toward the center of the liquid layer on the substrate with the substrate rotated. In this case, the liquid layer integrally moves outward from the substrate with its annular shape held by surface tension without being separated into a plurality of regions. This inhibits minute droplets from being formed, allowing the substrate to be reliably dried. Therefore, development defects caused by the liquid remaining on the substrate can be reliably prevented from occurring.

According to the present invention, the minute droplets on the substrate are inhibited from being formed, which allows the substrate to be reliably dried. Therefore, development defects caused by the liquid remaining on the substrate can be reliably prevented from occurring.

Other features, elements, characteristics, and advantages of the present invention will become more apparent from the following description of embodiments of the present invention with reference to the attached drawings.

BRIEF DESCRIPTION OF THE DRAWINGS

FIG. 5 is a diagram showing the rotational speed of a substrate in time series;

DETAILED DESCRIPTION OF THE INVENTION

A substrate processing apparatus and a substrate processing method according to an embodiment of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask, or the like.

(1) Configuration

Figure 1:
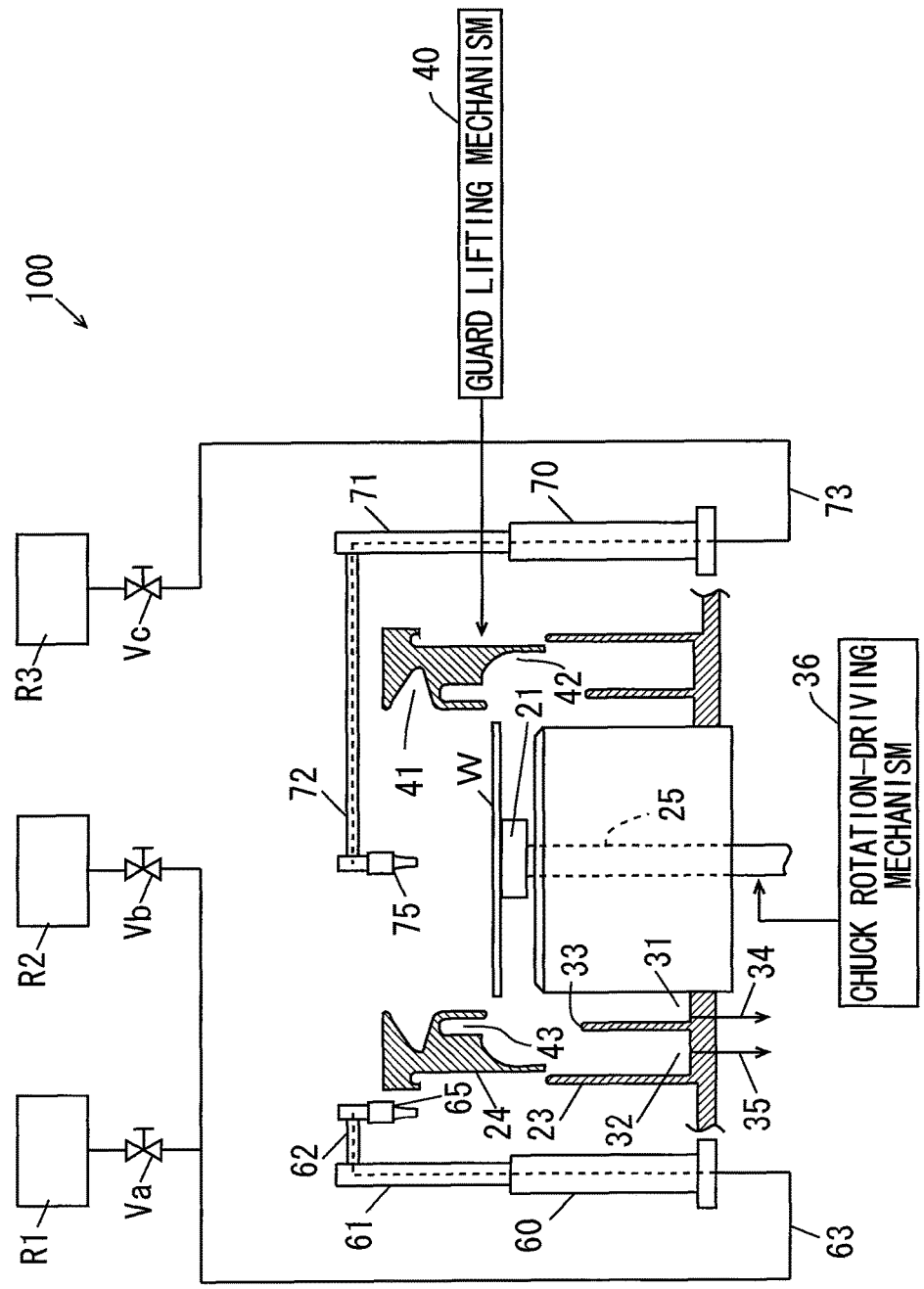
FIG. 1 is a diagram for explaining the configuration of a substrate processing apparatus.

FIG. 1 is a diagram for explaining the configuration of a substrate processing apparatus according to the present embodiment. In the substrate processing apparatuses, a resist film on a substrate that has been subjected to exposure processing is subjected to development processing.

As shown in FIG. 1, the substrate processing apparatus 100 includes a spin chuck 21 for holding a substrate W horizontally while rotating the substrate W around its vertical rotation axis passing through the center of the substrate W.

The spin chuck 21 is secured to an upper end of a rotating shaft 25 that is rotated by a chuck rotation-driving mechanism 36. Furthermore, a suction path (not shown) is formed in the spin chuck 21. By exhausting the suction path with the substrate W placed on the spin chuck 21 to adsorb a lower surface of the substrate W to the spin chuck 21 under vacuum, the substrate W can be held in a horizontal attitude.

Motors 60 and 70 are provided outside the spin chuck 21. A rotating shaft 61 is connected to the motor 60. An arm 62 is connected to the rotating shaft 61 so as to extend in the horizontal direction, and its tip is provided with a liquid supply nozzle 65. The motor 60 causes the rotating shaft 61 to rotate while causing the arm 62 to rotate, which causes the liquid supply nozzle 65 to move to above the substrate W held by the spin chuck 21.

A supply pipe 63 is provided so as to pass through the motor 60, the rotating shaft 61, and the arm 62. The supply pipe 63 is connected to a development liquid supply source R1 and a rinse liquid supply source R2 through a valve Va and a valve Vb, respectively. By controlling the opening and closing of the valves Va and Vb, it is possible to select a processing liquid supplied to the liquid supply nozzle 65 and adjust the supply amount of the processing liquid. Specifically, a development liquid is supplied to the liquid supply nozzle 65 by opening the valve Va, and a rinse liquid is supplied to the liquid supply nozzle 65 by opening the valve Vb. Pure water, for example, is used as the rinse liquid.

A rotating shaft 71 is connected to the motor 70. An arm 72 is connected to the rotating shaft 71 so as to extend in the horizontal direction, and its tip is provided with a gas supply nozzle 75. The motor 70 causes the rotating shaft 71 to rotate while causing the arm 72 to rotate, which causes the gas supply nozzle 75 to move to above the substrate W held by the spin chuck 21.

A supply pipe 73 is provided so as to pass through the motor 70, the rotating shaft 71, and the arm 72. The supply pipe 73 is connected to a gas supply source R3 through a valve Vc. Gas is supplied to the gas supply nozzle 75 by opening the valve Vc. An example of the gas is inert gas such as nitrogen gas or air.

The substrate W held on the spin chuck 21 is stored in a processing cup 23. A cylindrical partition wall 33 is provided inside the processing cup 23. A discharge space 31 for discharging the processing liquid (i.e., rinse liquid or development liquid) used for processing the substrate W is formed so as to surround the spin chuck 21. Furthermore, a liquid recovery space 32 for recovering the processing liquid used for processing the substrate W is formed between the processing cup 23 and the partition wall 33 so as to surround the discharge space 31.

A discharge pipe 34 for introducing the processing liquid into a liquid discharge processing device (not shown) is connected to the discharge space 31, and a recovery pipe 32 for introducing the processing liquid into a recovery processing device (not shown) is connected to the liquid recovery space 32.

A guard 24 is provided above the processing cup 23 for preventing the processing liquid on the substrate W from being scattered outward. The guard 24 is shaped to be rotationally-symmetric with respect to the rotating shaft 25. A liquid discharge guide groove 41 with a V-shaped cross section is formed in an annular shape inwardly at an upper end of the guard 24.

Furthermore, a liquid recovery guide 42 having an inclined surface that is inclined outwardly downward is formed inwardly at a lower end of the guard 24. A partition wall housing groove 43 for receiving the partition wall 633 in the processing cup 23 is formed in the vicinity of an upper end of the liquid recovery guide 42.

The guard 24 is provided with a guard lifting mechanism 40 composed of a ball-screw mechanism or the like. The guard lifting mechanism 40 moves the guard 24 upward and downward between a recovery position where the liquid recovery guide 42 is opposed to outer edges of the substrate W held on the spin chuck 21 and a discharge position where the liquid discharge guide groove 41 is opposed to the outer edges of the substrate W held on the spin chuck 21. When the guard 24 is in the recovery position (i.e., the position of the guard shown in FIG. 1), the processing liquid scattered outward from the substrate W is introduced into the liquid recovery space 32 by the liquid recovery guide 42, and is recovered through the recovery pipe 35. On the other hand, when the guard 24 is in the discharge position, the processing liquid scattered outward from the substrate W is introduced into the discharge space 31 by the liquid discharge guide groove 41, and is discharged through the discharge pipe 34. During the development processing, the position of the guard 24 is changed, as needed, according to the necessity of recovering or discharging the processing liquid.

Figure 2:
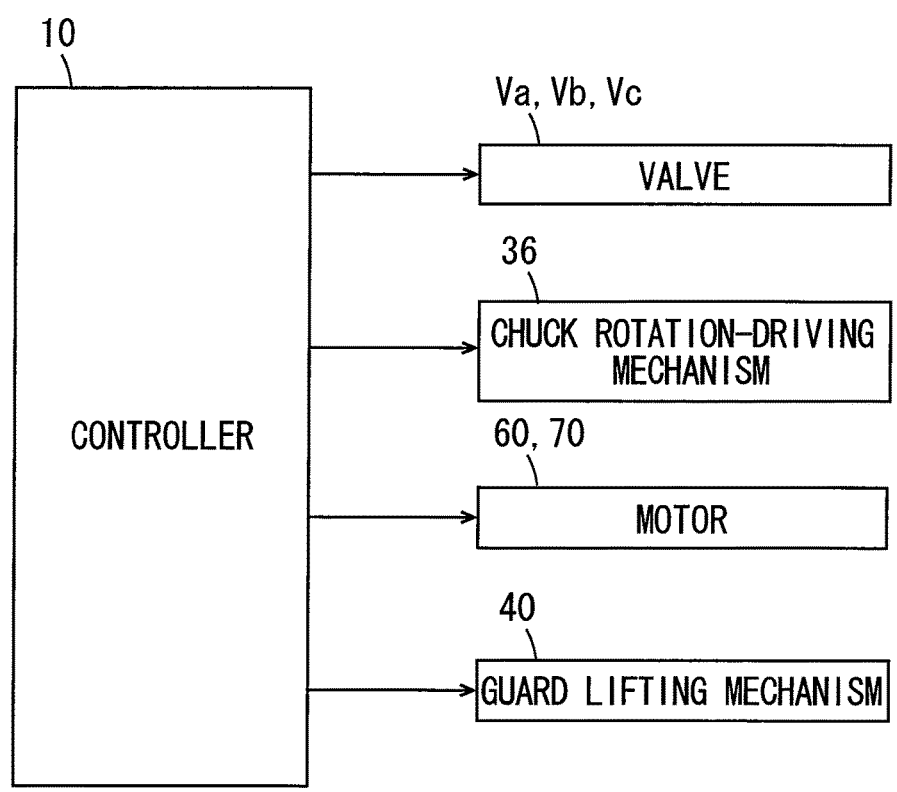
FIG. 2 is a block diagram showing a control system of the substrate processing apparatus.

FIG. 2 is a block diagram showing a control system of the substrate processing apparatus 100. As shown in FIG. 2, the substrate processing apparatus 100 includes a controller 10. The respective operations of the valves Va, Vb, and Vc, the chuck rotation-driving mechanism 36, the motors 60 and 70, and the guard lifting mechanism 40 are controlled by the controller 10.

(2) Operation

Description is now made of the operation of the substrate processing apparatus 100 with reference to FIG. 1. During the development processing, the liquid supply nozzle 65 moves to above the center of the substrate W. The development liquid is discharged to the center of the substrate W from the liquid supply nozzle 65 with the substrate W rotated by the spin chuck 21. In this case, the development liquid spreads from the center of the substrate W to its peripheral portion by a centrifugal force caused by the rotation of the substrate W. This causes the development liquid to be held on the substrate W. Thereafter, the discharge of the development liquid from the liquid supply nozzle 65 is stopped while the rotation of the substrate W is stopped. In the state, the development processing progresses on the substrate.

After an elapse of a predetermined time period, the rinse liquid is discharged onto the substrate W from the liquid supply nozzle 65, so that the development processing on the substrate W is stopped. Then, the rinse liquid is continuously discharged from the liquid supply nozzle 65 with the substrate W rotated at high speed, and the development liquid on the substrate W is washed away. Note that the development liquid may be held on the substrate W with the rotation of the substrate W stopped. Furthermore, the development liquid on the substrate W may be washed away with the rotation of the substrate W stopped.

Figure 3:
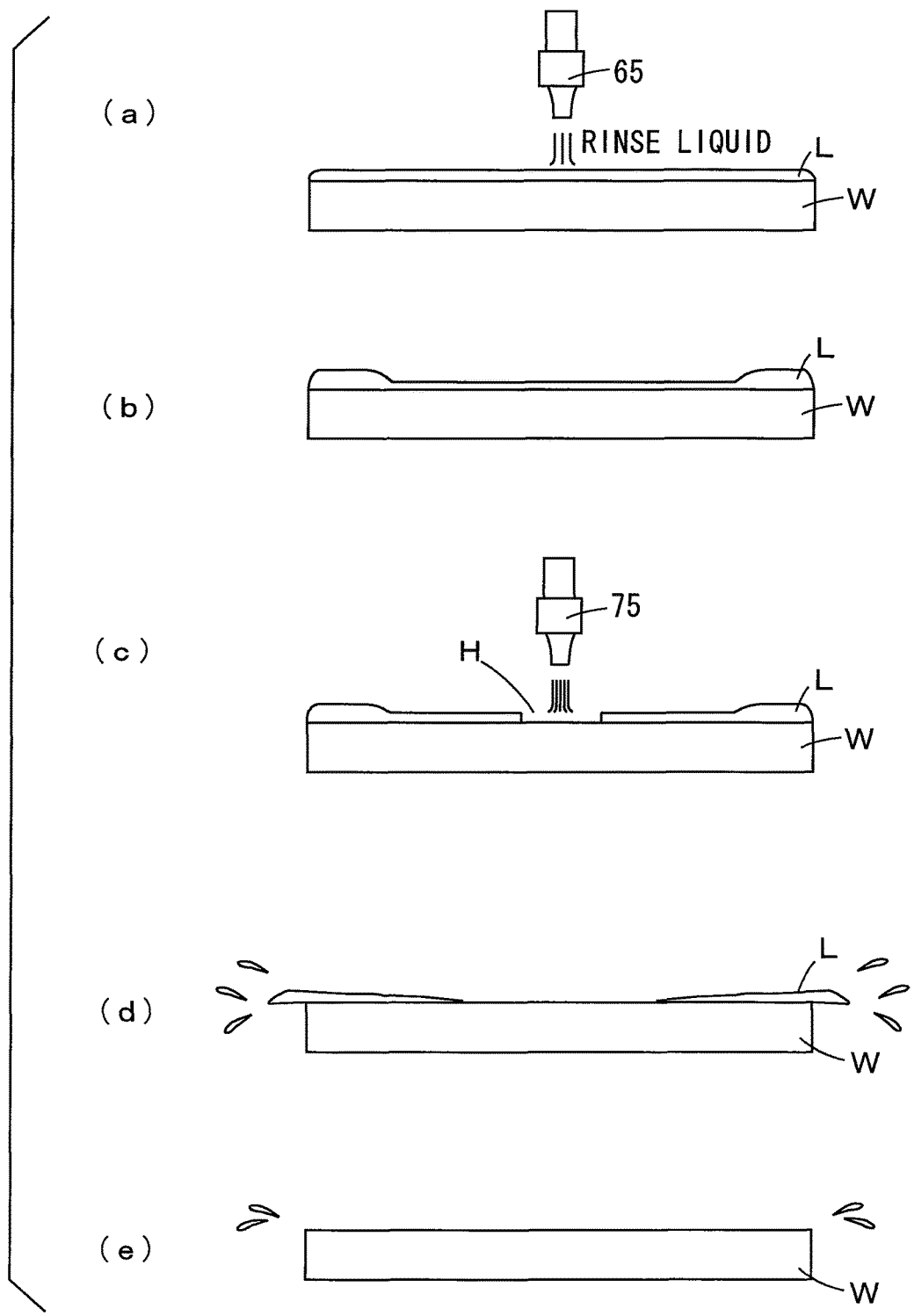
FIG. 3 is a diagram showing the steps of drying processing for a substrate.
Figure 4:
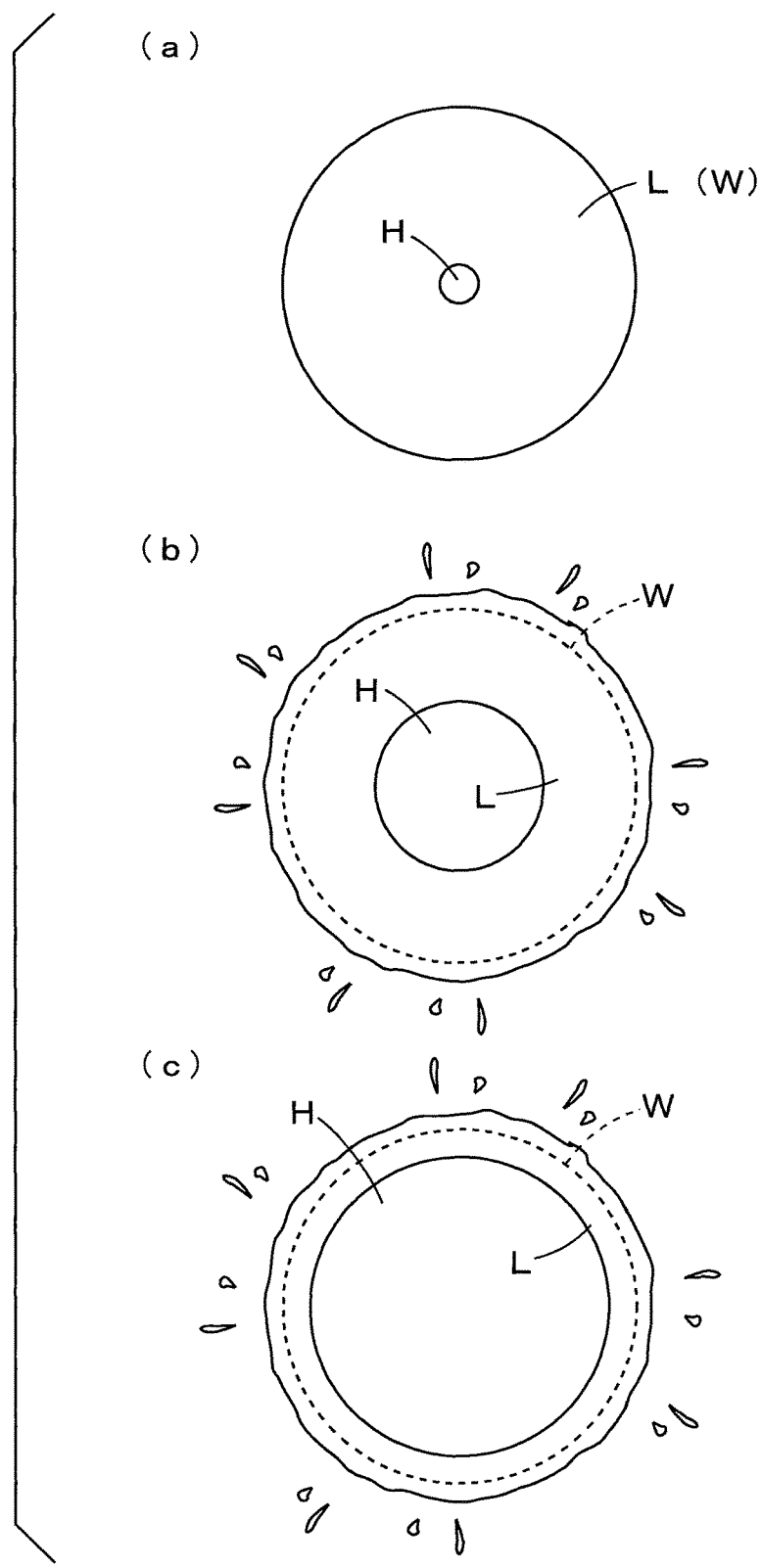
FIG. 4 is a diagram for explaining the movement of a rinse liquid during drying processing for a substrate.

Then, the substrate W is subjected to drying processing. FIG. 3 is a diagram showing the steps of the drying processing for the substrate W, and FIG. 4 is a diagram for explaining the movement of the rinse liquid during the drying processing for the substrate W. FIG. 5 is a diagram showing the rotational speed of the substrate W in time series.

After the development liquid on the substrate W is washed away with the rinse liquid, the rotational speed of the substrate W is reduced. This causes the amount of the rinse liquid that is shaken off by the rotation of the substrate W to be reduced, causing a liquid layer L of the rinse liquid to be formed over the whole top surface of the substrate W, as shown in FIG. 3(a). The liquid layer L may be formed on the substrate W by stopping the supply of the rinse liquid and the rotation of the substrate W once and then, rotating the substrate W at low speed again. Alternatively, the liquid layer L may be formed on the substrate W with the rotation of the substrate W stopped.

Then, the supply of the rinse liquid is stopped while the liquid supply nozzle 65 retreats to a predetermined position. Thereafter, the rotational speed of the substrate W is increased. In this case, a centrifugal force exerted on the center of the liquid layer L is smaller than a centrifugal force exerted on the peripheral portion thereof. Therefore, tension that is balanced with the centrifugal force exerted on the peripheral portion of the liquid layer L is exerted on the center of the liquid layer L. This causes the liquid layer L to be held on the substrate W without being scattered outward. The increase in the rotational speed of the substrate W causes the centrifugal force to be slightly greater than the tension, thereby causing the liquid layer L to be held on the substrate W with the thickness thereof in the peripheral portion increased and the thickness thereof at the center reduced, as shown in FIG. 3(b).

Then, the gas supply nozzle 75 moves to above the center of the substrate W. The gas is discharged toward the center of the liquid layer L from the gas supply nozzle 75, so that a hole H is formed at the center of the liquid layer L, as shown in FIG. 3(c). This causes the tension that is balanced with the centrifugal force exerted on the peripheral portion of the liquid layer L to disappear. Furthermore, the gas is discharged while the rotational speed of the substrate W is further increased. This causes the liquid layer L to move outward from the substrate W, as shown in FIGS. 3(d) and 3(e).

At this time, the liquid layer L integrally move outward from the substrate W with its annular shape held by surface tension without being separated into a plurality of regions, as shown in FIGS. 4(a) and 4(c). This inhibits minute droplets of the rinse liquid from being formed, allowing the liquid on the substrate W to be reliably removed.

Here, the change in the rotational speed of the substrate W during the drying processing for the substrate W will be described in detail.

As shown in FIG. 5, the substrate W is rotated at a rotational speed S1 in a time period T1. The rotational speed S1 is 10 rpm, for example. In this time period T1, the rinse liquid is supplied onto the substrate W. In this case, the liquid layer L can be uniformly formed on the substrate W even with the substrate slightly inclined to a horizontal plane. Note that the rotation of the substrate W may be stopped in the time period T1, provided that the liquid layer L can be uniformly formed over the whole substrate W.

Then, the substrate W is rotated at a rotational speed S2 higher than the rotational speed S1 in a time period T2. The rotational speed S2 is 10 to 100 rpm, for example. This causes the liquid layer L to spread over the whole substrate W while causing the liquid layer L to be held on the substrate W by surface tension.

Then, the substrate W is rotated at a rotational speed S3 higher than the rotational speed S2 in a time period T3. The rotational speed S3 is 100 to 1000 rpm, for example. In the case of transition from the time period T2 to the time period T3, the gas is discharged to the substrate W. In this case, the liquid layer L can be integrally moved outward from the substrate W with the annular shape held.

Note that the timing at which the gas is discharged may be immediately before the transition from the time period T2 to the time period T3 or immediately after the transition to the time period T3. Furthermore, a time period during which the gas is discharged is 0.5 to 8 sec, for example. That is, inert gas may be discharged only for a short time period during which the hole H (FIG. 6) is formed in the liquid layer L. Alternatively, inert gas may be continuously discharged until the liquid layer L on the substrate W is removed.

Note that the rotational speed of the substrate W may be changed, as needed, depending on the hydrophobic properties of the resist film on the substrate W, the wettability (e.g., the contact angle) of the rinse liquid, or the like. When the hydrophobic properties of the resist film are high, for example, the liquid layer L is easy to be separated into a plurality of regions so that the droplets are easy to form. Therefore, it is preferable that the rotational speed of the substrate W is set to be lower.

Although in the present embodiment, the rotational speed of the substrate W is increased in three stages (rotational speeds S1, S2, and S3) as shown in FIG. 5, the present invention is not limited to the same. For example, the rotational speed may be increased in two stages or four or more stages. Alternatively, the rotational speed may be increased not gradually but continuously.

(3) Effect of Present Embodiment

Thus, the liquid layer L is formed on the substrate W and is integrally moved outward from the substrate W with the annular shape held without being separated into a plurality of regions, which can prevent the minute droplets from being formed. This allows the rinse liquid on the substrate W to be reliably removed. Therefore, development defects caused by the droplets remaining on the substrate W can be reliably prevented.

(4) Another Embodiment

Although in the above-mentioned embodiment, the development liquid and the rinse liquid are discharged from the common liquid supply nozzle 65, a nozzle for discharging a development liquid and a nozzle for discharging a rinse liquid may be separately provided. Usable as the nozzles are various types of nozzles such as a straight nozzle and a slit nozzle.

Figure 6:
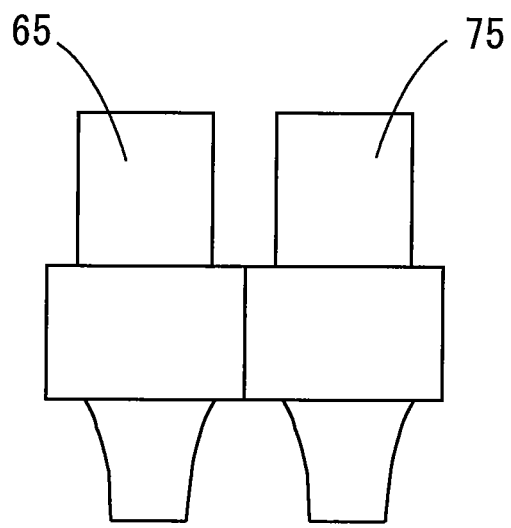
FIG. 6 is a diagram showing another example of a liquid supply nozzle and a gas supply nozzle.

Alternatively, the liquid supply nozzle 65 and the gas supply nozzle 75 may be integrally provided, as shown in FIG. 6. In this case, the liquid supply nozzle 65 and the gas supply nozzle 75 need not be separately moved when a substrate W is subjected to cleaning processing or drying processing, which allows a driving mechanism to be simplified.

Figure 7:
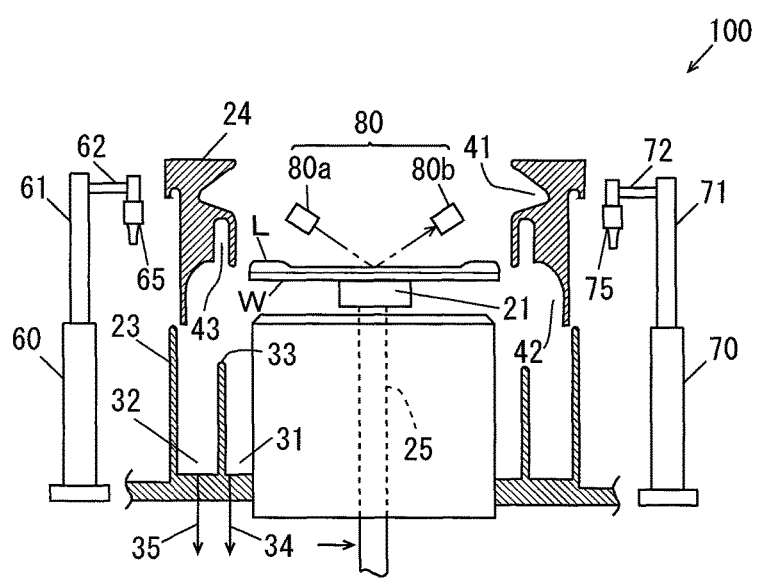
FIG. 7 is a diagram for explaining another configuration of a substrate processing apparatus.

Furthermore, a layer thickness sensor 80 for detecting the thickness of a liquid layer L on the substrate W may be provided within the substrate processing apparatus 100, as shown in FIG. 7. The layer thickness sensor 80 includes a light projector 80a and a light receiver 80b. The illustration of the liquid supply nozzle 65, the gas supply nozzle 75, and the like is omitted in FIG. 7.

In the substrate processing apparatus 100 shown in FIG. 7, the thickness in the vicinity of the center of the liquid layer L formed on the substrate W is detected by the layer thickness sensor 80 during the drying processing for the substrate W, and the timing at which gas is discharged and the timing at which the rotational speed of the substrate W is increased are adjusted depending on the change in the thickness.

Specifically, in a case where the substrate W is being rotated at a low rotational speed S2 (see FIG. 5) after the liquid layer L is formed on the substrate W, when the thickness in the vicinity of the center of the liquid layer L that is detected by the layer thickness sensor 80 is less than a threshold value previously set, the gas is discharged toward the liquid layer L while the rotational speed of the substrate W is increased.

In this case, the gas can be discharged with the center of the liquid layer L sufficiently thinned and the liquid layer L not separated into a plurality of regions by a centrifugal force. Therefore, the hole H can be reliably formed at the center of the liquid layer L, and the liquid layer L can be integrally moved outward from the substrate W with its annular shape held. This allows a rinse liquid on the substrate W to be reliably removed.

Furthermore, each of units may be controlled, by previously making a database of the values of physical properties such as the hydrophobic properties of the resist film and the wettability (e.g., the contact angle) of the rinse liquid and automatically calculating the most suitable timing at which gas is discharged and the most suitable rotational speed of the substrate W, as needed, depending on the values of the physical properties, on the basis of their calculated values.

(5) Correspondences between Constituent Elements in the Claims and Parts in Embodiments In the following two paragraphs, non-limiting examples of correspondences between various elements recited in the claims below and those described above with respect to various embodiments of the present invention are explained.

In the embodiments described above, the spin chuck 21 is an example of a substrate holding device, the chuck rotation-driving mechanism 36 is an example of a rotation-driving device, the liquid supply nozzle 65 is an example of a liquid layer formation device, the gas supply nozzle 75 is an example of a gas discharger, the rotational speed S1 is an example of a first rotational speed, the rotational speed S3 is an example of a second rotational speed, the rotational speed S2 is an example of third and fourth rotational speeds, and the layer thickness sensor 80 is an example of a layer thickness detector.

As each of various elements recited in the claims, various other elements having configurations or functions described in the claims can be also used.

While various embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A substrate processing method for a substrate that has been subjected to exposure processing comprising the steps of:
   holding the substrate horizontally; a photosensitive film is formed on the substrate;
   supplying a development liquid onto the substrate which is being held;
   supplying a rinse liquid onto the substrate to wash away the development liquid;
   rotating the substrate at a first rotational speed after the development liquid is washed away;
   forming a liquid layer of the rinse liquid on the photosensitive film so as to cover an entire upper surface of the photosensitive film on the substrate while the substrate is being rotated at said first rotational speed; and
   discharging only an inert gas toward a center of the liquid layer of the rinse liquid on the substrate, wherein discharging the inert gas includes the steps of:
   stopping the supply of the rinse liquid and subsequently increasing the rotational speed of the substrate from said first rotational speed to a fourth rotational speed after the liquid layer of the rinse liquid is formed on the substrate,
   maintaining the rotational speed of the substrate constant at said fourth rotational speed for a predetermined maintaining time period; said predetermined time period lasting from when the rotational speed of the substrate reaches said fourth rotational speed and a thickness of the center of the liquid layer of the rinse liquid is equal to or larger than a thickness of a peripheral portion of the liquid layer of the rinse liquid to when the thickness of the center of the liquid layer of the rinse liquid is smaller than the thickness of the peripheral portion of the liquid layer of the rinse liquid due to a centrifugal force while the entire upper surface of the substrate is kept covered with the liquid layer of the rinse liquid due to tension exerted on the liquid layer of the rinse liquid, the fourth rotational speed is 10 to 100 rpm,
   subsequently starting increasing the rotational speed of the substrate from said fourth rotational speed to a second rotational speed that is higher than said fourth rotational speed when the predetermined maintaining time period terminates, and
   starting discharging only the inert the gas toward the center of the liquid layer of the rinse liquid on the substrate after the state of the liquid layer of the rinse liquid changes from the state where the thickness of the center of the liquid layer of the rinse liquid is equal to or larger than the thickness of the peripheral portion of the liquid layer of the rinse liquid to the state where the thickness of the center of the liquid layer of the rinse liquid is smaller than the peripheral portion of the liquid layer of the rinse liquid and before the substrate reaches said second rotational speed, discharge of only the inert gas occurring with the substrate being rotated at a third rotational speed that is not lower than said fourth rotational speed and lower than said second rotational speed, thereby forming an opening at the center of the liquid layer of the rinse liquid on the substrate and causing the liquid layer of the rinse liquid to integrally move outward from a center of the substrate, with an annular shape of the liquid layer of the rinse liquid held by surface tension inhibiting a plurality of separate droplets of the rinse liquid from being formed on the substrate.

2. The substrate processing method according to claim 1, wherein the second rotational speed is less than or equal to 1000 rpm.

* * * * *